US008691651B2

(12) United States Patent  (10) Patent No.: US 8,691,651 B2
Dai et al.  (45) Date of Patent: Apr. 8, 2014

(54) METHOD OF FORMING NON-PLANAR FET

(75) Inventors: Sheng-Huei Dai, Taitung County (TW);
Rai-Min Huang, Taipei (TW);
Chen-Hua Tsai, Hsinchu County (TW);
Shih-Hung Tsai, Tainan (TW);
Chien-Ting Lin, Hsinchu (TW)

(73) Assignee: United Microelectronics Corp.,
Science-Based Industrial Park, Hsin-Chu
(TW)

( * ) Notice: Subject to any disclaimer, the term of this patent is extended or adjusted under 35 U.S.C. 154(b) by 152 days.

(21) Appl. No.: 13/218,438

(22) Filed: Aug. 25, 2011

(65) Prior Publication Data

US 2013/0052781 A1 Feb. 28, 2013

(51) Int. Cl.
*H01L 21/8234* (2006.01)
*H01L 21/336* (2006.01)

(52) U.S. Cl.
USPC .......................................... 438/275; 438/296

(58) Field of Classification Search
USPC .............. 438/275, 296; 257/E29.052, E29.13
See application file for complete search history.

(56) References Cited

U.S. PATENT DOCUMENTS

| 6,043,138 | A  | 3/2000  | Ibok |
| 6,492,216 | B1 | 12/2002 | Yeo |
| 6,921,963 | B2 | 7/2005  | Krivokapic |
| 7,087,477 | B2 | 8/2006  | Fried |
| 7,091,551 | B1 | 8/2006  | Anderson |
| 7,247,887 | B2 | 7/2007  | King |
| 7,250,658 | B2 | 7/2007  | Doris |
| 7,265,008 | B2 | 9/2007  | King |
| 7,309,626 | B2 | 12/2007 | Ieong |
| 7,352,034 | B2 | 4/2008  | Booth, Jr. |
| 7,470,570 | B2 | 12/2008 | Beintner |
| 7,508,031 | B2 | 3/2009  | Liu |
| 7,528,465 | B2 | 5/2009  | King |
| 7,531,437 | B2 | 5/2009  | Brask |
| 7,569,857 | B2 | 8/2009  | Tolchinsky et al. |
| 7,605,449 | B2 | 10/2009 | Liu |
| 2004/0195624 | A1 | 10/2004 | Liu |
| 2005/0051825 | A1 | 3/2005  | Fujiwara |
| 2006/0099830 | A1 | 5/2006  | Walther |
| 2006/0286729 | A1 | 12/2006 | Kavalieros |
| 2007/0004167 | A1* | 1/2007 | Lee ............................... 438/427 |
| 2007/0020565 | A1 | 1/2007  | Koh |
| 2007/0069293 | A1* | 3/2007 | Kavalieros et al. ........... 257/350 |
| 2007/0108528 | A1 | 5/2007  | Anderson |
| 2007/0158756 | A1* | 7/2007 | Dreeskornfeld et al. ..... 257/374 |
| 2007/0158765 | A1 | 7/2007  | Ahn |
| 2008/0157208 | A1 | 7/2008  | Fischer |
| 2008/0248429 | A1 | 10/2008 | Chou |
| 2009/0090976 | A1* | 4/2009 | Kavalieros et al. ........... 257/369 |
| 2009/0124097 | A1 | 5/2009  | Cheng |
| 2009/0233238 | A1 | 9/2009  | Hsu |
| 2009/0242964 | A1 | 10/2009 | Akil |
| 2009/0258500 | A1 | 10/2009 | Yang |
| 2009/0269916 | A1 | 10/2009 | Kang |
| 2010/0048027 | A1 | 2/2010  | Cheng |
| 2010/0072553 | A1 | 3/2010  | Xu |
| 2010/0144121 | A1 | 6/2010  | Chang |
| 2010/0167506 | A1 | 7/2010  | Lin |

* cited by examiner

*Primary Examiner* — Kevin Parendo
(74) *Attorney, Agent, or Firm* — Winston Hsu; Scott Margo

(57) ABSTRACT

A method of forming a Non-planar FET is provided. A substrate is provided. An active region and a peripheral region are defined on the substrate. A plurality of VSTI is formed in the active region of the substrate. A part of each VSTI is removed to expose a part of sidewall of the substrate. Then, a conductor layer is formed on the substrate which is then patterned to form a planar FET gate in the peripheral region and a Non-planar FET gate in the active region simultaneously. Last, a source/drain region is formed on two sides of the Non-planar FET gate.

11 Claims, 7 Drawing Sheets

METHOD OF FORMING NON-PLANAR FET

BACKGROUND OF THE INVENTION

1. Field of the Invention

The present invention relates to a method of forming a Non-planar FET, and more particularly, to a method of simultaneously forming a Non-planar FET and a planar FET.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demand of products.

However, with the increasing miniaturization of electronic products, current planar FETs no longer meet the requirements of the products. Thus, there is a development for non-planar FETs such as non-planar FETs (Fin-FET) to achieve a high drive current and to lessen the short channel effect. Because the Fin-FET basically has a three-dimensional structure, the forming method thereof is more complicated than that of the traditional structure. Generally, the Fin-FET is formed on a silicon-on-insulator (SOI) substrate. There are still some problems needing to be overcome when forming the Fin-FET on traditional bulk-silicon substrate. Moreover, it is also difficult to integrate Fin-FET forming method into conventional planar FET forming method.

SUMMARY OF THE INVENTION

The present invention therefore provides a method of simultaneously forming a Non-planar FET and a planar FET.

According to one embodiment, a method of forming a Non-planar FET is provided. A substrate is provided. An active region and a peripheral region are defined on the substrate. A plurality of very shallow trench isolations (VSTI) is formed in the active region of the substrate. A part of each VSTI is removed to expose a part of sidewall of the substrate. Then, a conductor layer is formed on the substrate which is then patterned to form a planar FET gate in the peripheral region and a Non-planar FET gate in the active region simultaneously. Last, a source/drain region is formed on two sides of the Non-planar FET gate.

The method can simultaneously form the gate of the gate of the Non-planar FET and the gate of the planar FET, which are horizontally level with each other. The process of forming the STI and the VSTI use the same mask layer so as to streamline the method.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
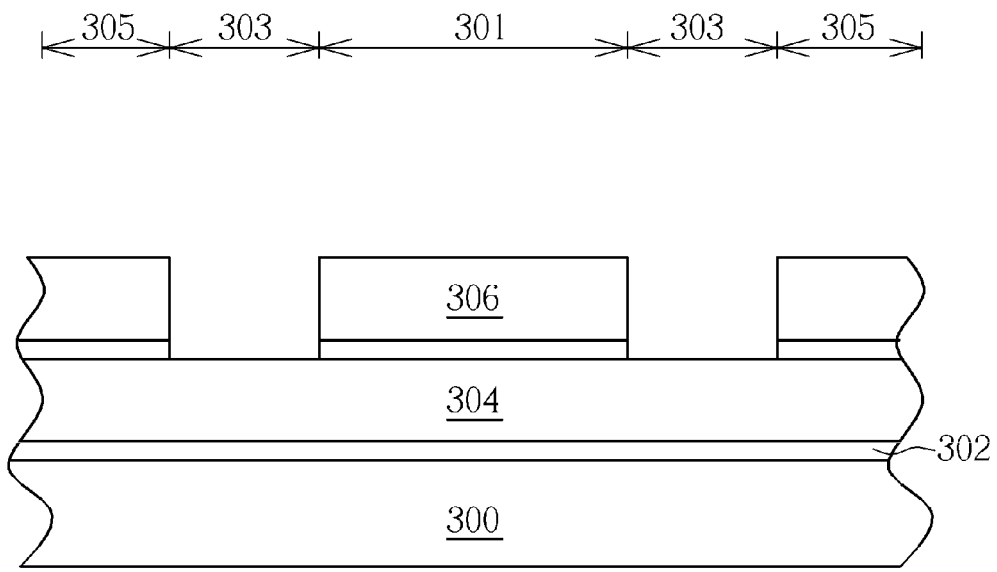
FIG. 1 to FIG. 10 illustrate schematic diagrams of the method of forming a Non-planar FET in the present invention.

Please refer to FIG. 1 to FIG. 10, which illustrate schematic diagrams of the method of forming a Non-planar FET in the present invention. As shown in FIG. 1, a substrate 300 is provided. The substrate 300 may include a silicon substrate, an epitaxial silicon substrate, a silicon germanium substrate, a silicon carbide substrate or a silicon-on-insulator (SOI) substrate, but is not limited thereto. An active region 301, an isolation region 303 encompassing the active region 301, and a peripheral region 305 are defined on the substrate 300. In the subsequent steps, at least a Non-planar FET will be formed in the active region 301 while at least a high-voltage device such as 1.8V or higher MOS will be formed in the peripheral region 305 to serve as an input/output region, for example. Then, a liner layer 302 and a mask layer 304 are formed on the substrate. In one embodiment, the liner 302 may include $SiO_2$, and the mask layer 304 can include SiN. The mask layer 304 has a thickness ranging from 60 angstroms (Å) and 150 Å, preferably 100 Å. The liner 302 has a thickness ranging from 15 Å to 50 Å, preferably 20 Å. Next, a first patterned photoresist layer 306 is formed on the mask layer 304. In one embodiment, the first patterned photoresist layer 306 can include a single-layered structure or a multi-layered structure. For instance, the first patterned photoresist layer 306 can include an anti-reflection layer. The first patterned photoresist layer 306 has a plurality of openings to expose the mask layer 304 in the isolation area 303. An etching process is then carried out by using the first patterned photoresist layer 306 as a mask to etch the mask layer 304 to transfer the pattern to the mask layer 304 and the liner layer 302. The first patterned photoresist layer 306 is then removed.

Figure 2:
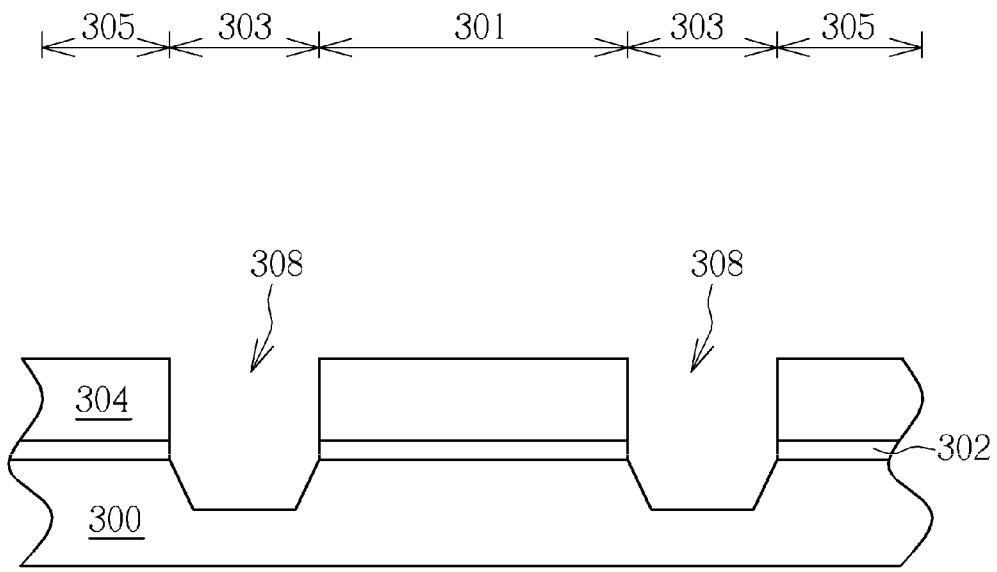

As shown in FIG. 2, another etching process is performed by using the mask layer 304 as a mask to etch the substrate 300 to form a first trench 308 in the isolation region 308. The first trench 308 preferably has a thickness between 2000 Å and 3000 Å. After forming the first trench 308, a pulling back process can selectively performed to pull back the mask layer 304 away from the first trench 308. In one embodiment, a cleaning step can further be selectively performed. For example, an $RCA_1$ solution ($NH_4OH+H_2O_2+H_2O$) or $RCA_2$ solution ($HCl+H_2O_2+H_2O$) can be used to wash the bottom surface and the sidewall of the first trench 308. In another embodiment, an in-situ stream process can be performed to form an oxide layer on the bottom surface and the sidewall of the first trench 308.

Figure 3:
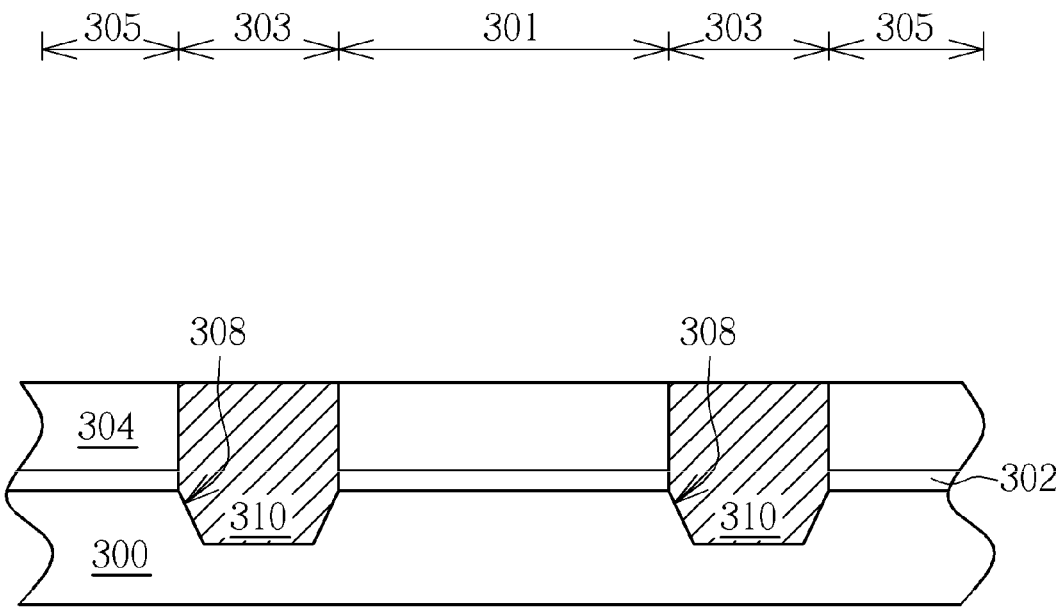

As shown in FIG. 3, a first insulation layer 310 can be formed on the substrate 300 to at least fill the first trench 308. In one embodiment, the first insulation layer 310 includes $SiO_2$ or other suitable insulation materials. Then, a planarization process, such as chemical mechanical polishing process (CMP), is used to make the first insulation layer 310 and mask layer 306 being level with each other.

Figure 4:
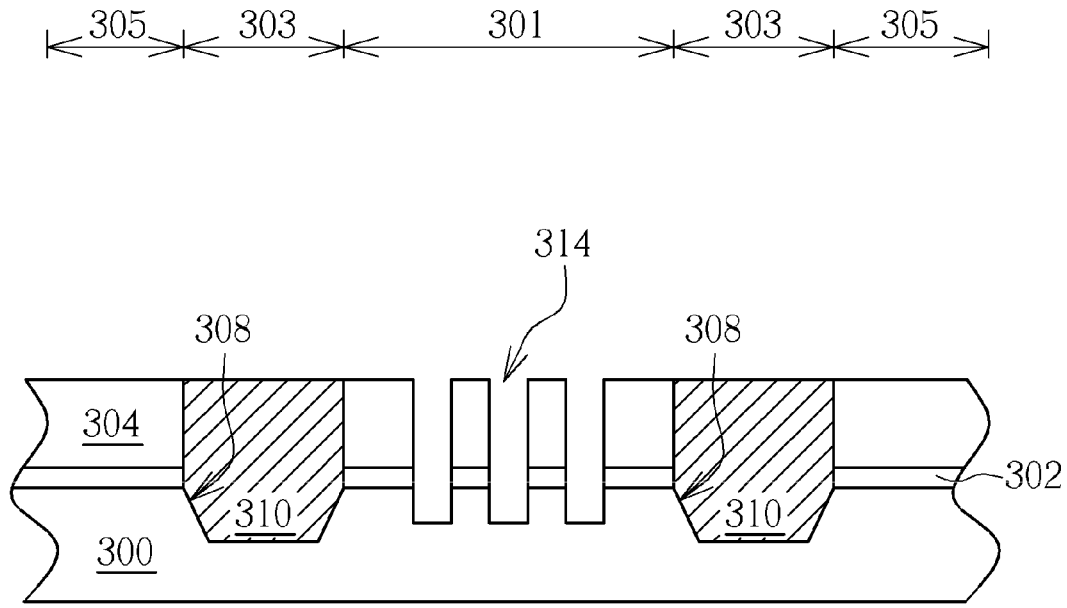

As shown in FIG. 4, the mask layer 304 is patterned. For example, a second patterned photoresist layer (not shown) is formed on the substrate 300 to cover the isolation region 303, the peripheral region 305 and a part of the active region 301. An etching process is performed by using the second patterned photoresist layer as a mask to transfer the pattern onto the mask layer 304 and the liner layer 302. Another etching process is then carried out by using the patterned mask layer 304 and the liner layer 302 to etch the substrate 300, thereby by forming a plurality of second trenches 314. The thickness of the second trench 314 is about 200 Å to 500 Å. The second trenches 314 are substantially parallel to each other and are disposed in the active region 301.

Figure 5:
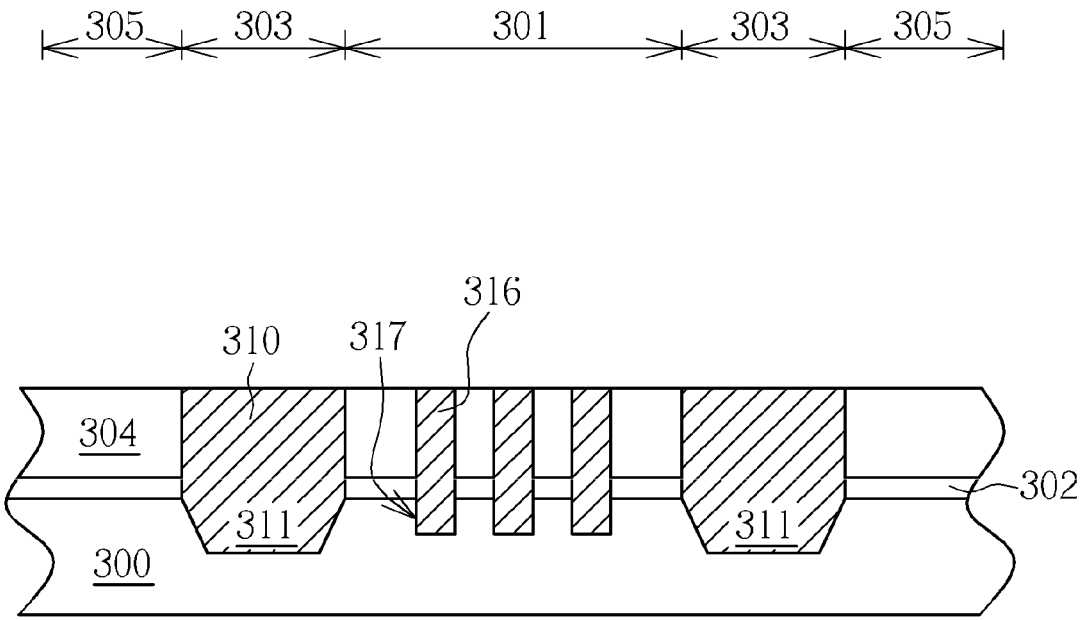

As shown in FIG. 5, a second insulation layer 316 is formed on the substrate 300 to at least fill into the second trenches 314. The second insulation layer 316 can have the same material as the first insulation layer 310 such as SiO$_2$ or they can be different. A planarization process is then carried out to make the second insulation layer 316 level with the mask layer 304 and the first insulation layer 310. Thus, in the isolation region 303, the first insulation layer 310 in the first trench 308 becomes a shallow trench isolation (STI) 311 while in the active region 301, the second isolation layer 316 in the second trenches 314 become a plurality of very shallow trench isolations (VSTI) 317. In addition, in another embodiment of the present invention, the VSTI 317 can be formed before forming the STI 311. It is noted that both the VSTI 317 and the STI 311 are formed by using the same mask layer 304.

Figure 6:
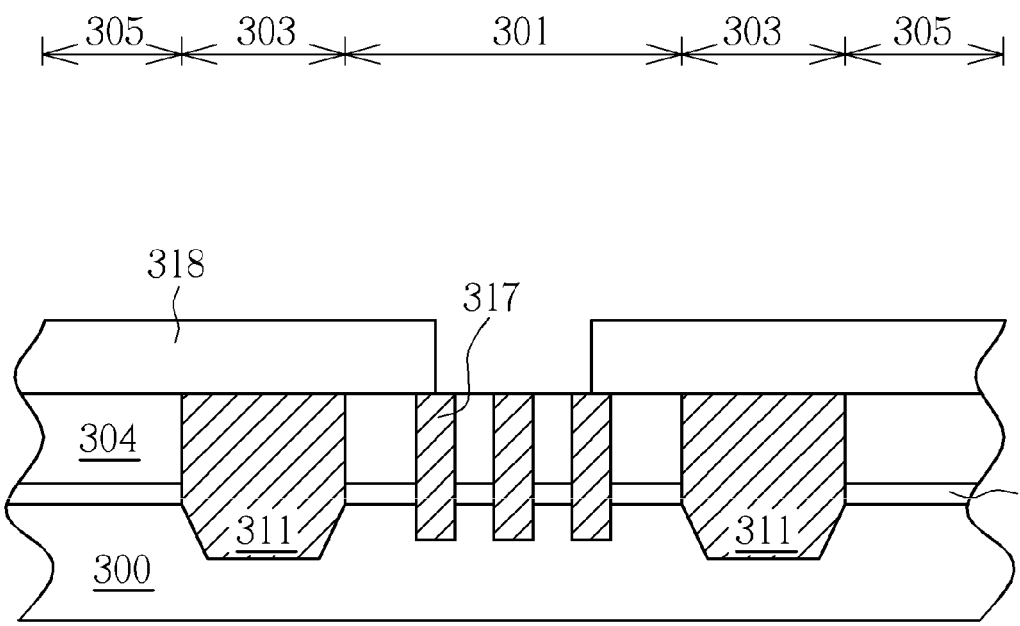

As shown in FIG. 6, a third patterned photoresist layer 318 is formed on the substrate 300. In one embodiment, the third patterned photoresist layer 318 has an opening to expose the second insulating layer 316 in the active area 301. In another preferred embodiment, as shown in FIG. 6, the sidewall of the opening can be slightly extends inwardly and stays on the top surface of the most peripheral, VSTI 317 but will not extend to the top surface of the mask layer 304 between two VSTI 317.

Figure 7:
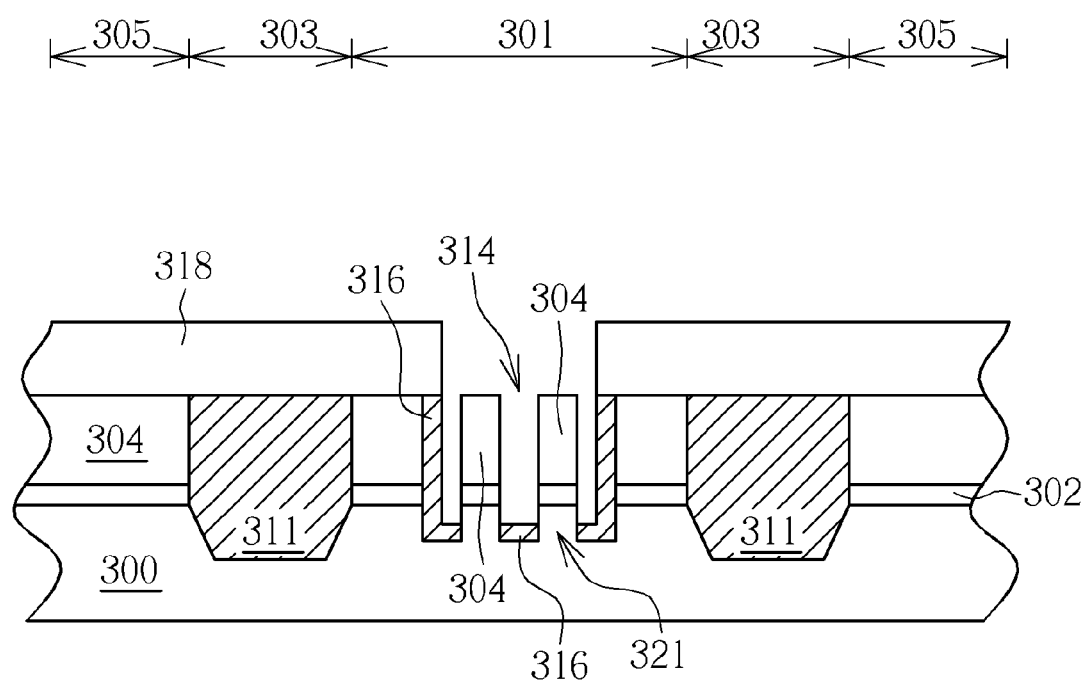

As shown in FIG. 7, an etching process is performed by using the third patterned photoresist layer to etch the second insulation layer 316 not covered by the third patterned photoresist layer 318. The etching process extends to the substrate 300 and makes the substrate 300 between the second trench 314 exposed the sidewall, thereby forming the required fin structure 321.

Figure 8:
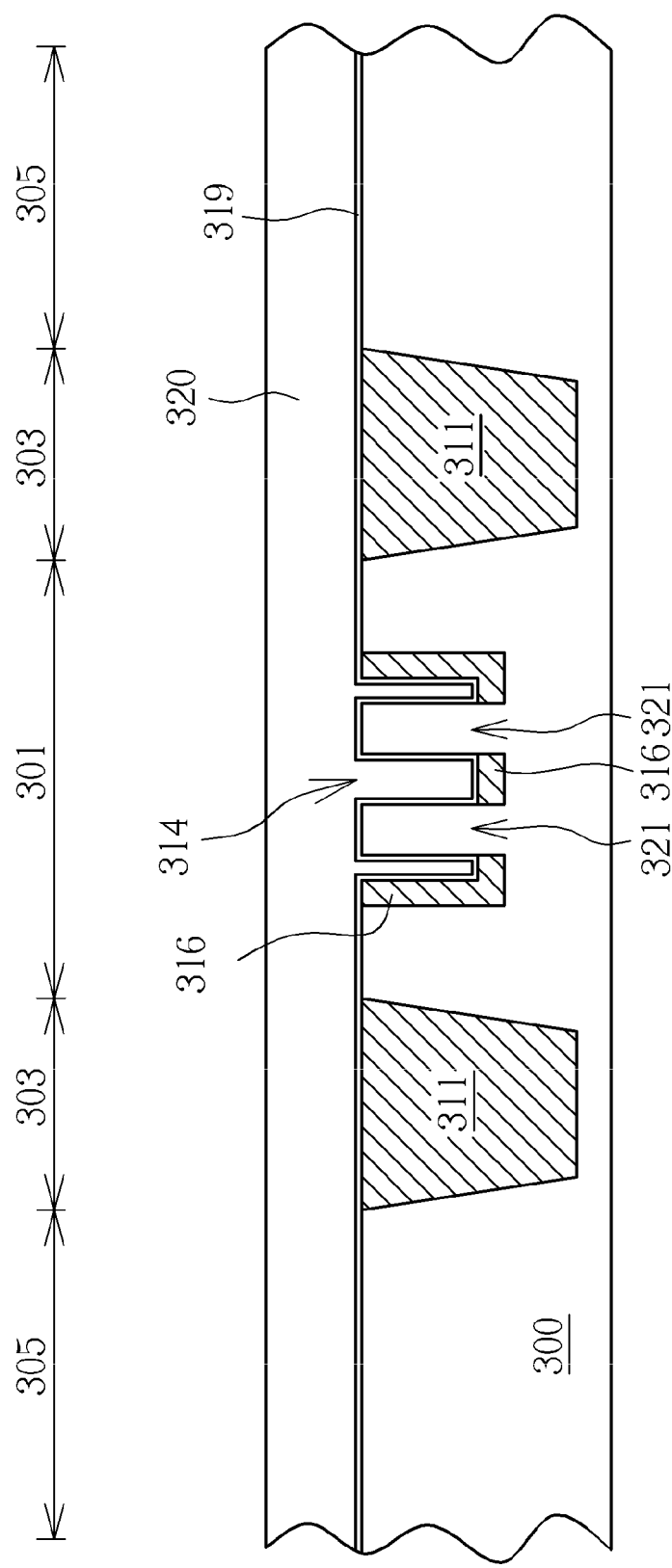

As shown in FIG. 8, after removing the third patterned photoresist layer 318, the mask layer 304 and the liner layer 302, a dielectric layer 319 and a conductive layer 320 are sequentially formed on the substrate 300. The dielectric layer 319 and the conductive layer 320 fill into the second trenches 314 and contact the exposed bottom surface and the sidewall of the substrate 300, that is, the bottom surface and the sidewall of the fin structure 321, so as to enlarge the length of the channel gate. In one embodiment, the conductive layer 320 can be metal or poly-silicon. The dielectric layer 318 can be SiO$_2$ or high-k material formed by a CVD process or a thermal oxidation process. The high-k dielectric layer can be selected from a group consisting of, for example, hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta2O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST).

Figure 9:
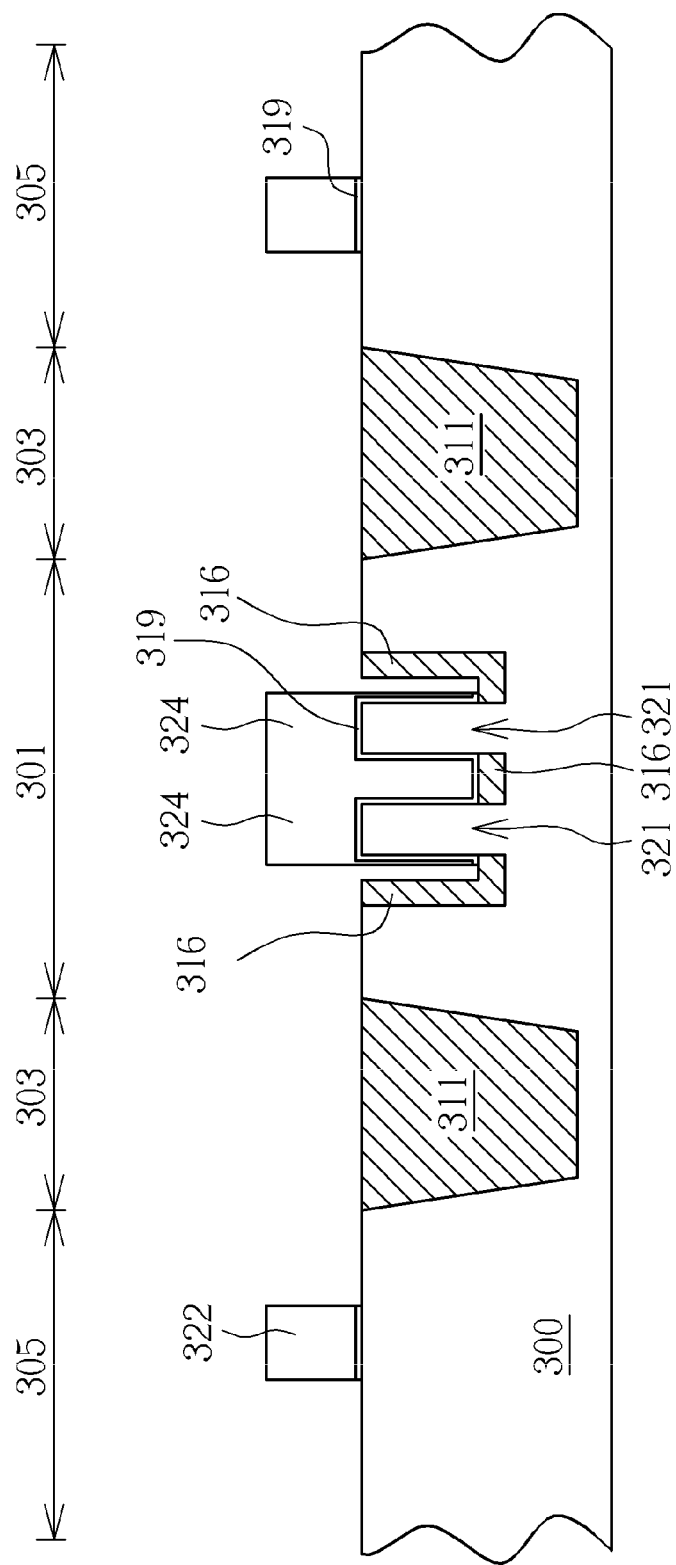
Figure 10:
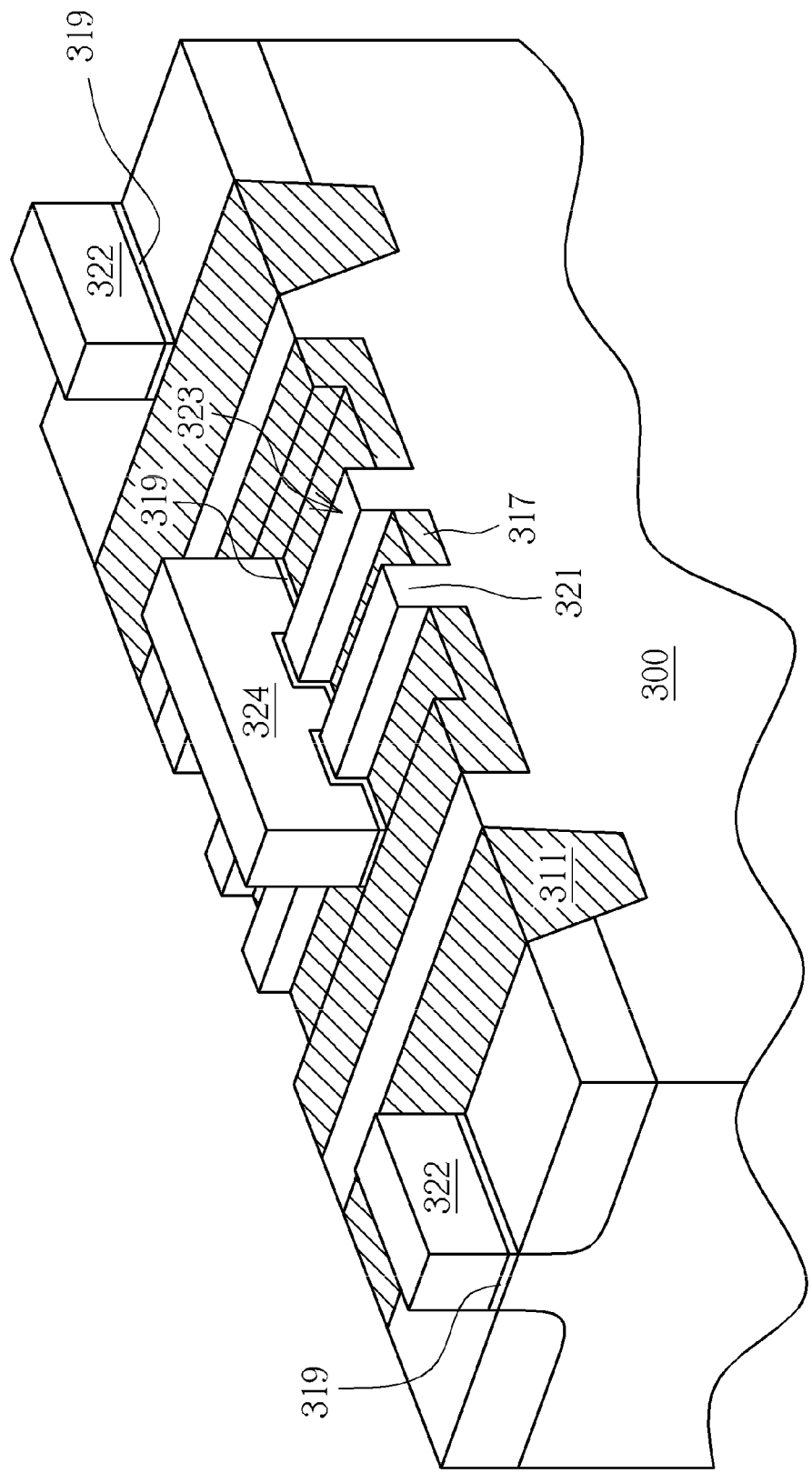

As shown in FIG. 9 and FIG. 10, the conductive layer 320 and the dielectric layer 319 are patterned. The conductive layer 320 in the active region 301 therefore becomes at least a gate 324 of the Non-planar FET, and the conductive layer 320 in the peripheral region 305 therefore becomes at least a gate 322 of the planar FET. In one embodiment, a source/drain region 323 can be formed in Fin structure 321 on two sides of the gate 324 in the active region 301 and in the substrate 300 at two sides of the gate 322 in the peripheral region 305. Consequently, the Non-planar FET and the planer FET are completed. In another embedment, a plurality of processes can further be carried out, for example, the step of forming salicide or the step of forming a stress layer on the Non-planar FET or the planar FET to form a selective strain scheme (SSS). The above-mentioned description takes forming a FIN-FET for example, and it is realized that other kinds of non-planar FET can be manufactured by the method set forth in the present invention.

It is noted that, the height of the gate of the Non-planar FET is larger than that of the planar FET, and the gate of the Non-planar FET is horizontally level with the gate of the planar FET. It is advantageous that when subsequently performing the planarization step in the metal gate last process, it is more precise to simultaneous expose the gate of the Non-planar FET and the gate of the planar FET.

In light of above, the present invention provides a method to simultaneously form the gate of the gate of the Non-planar FET and the gate of the planar FET, which are level with each other in horizontal. Besides, the process of forming the STI and the VSTI use the same mask layer so the method can be streamlined.

Those skilled in the art will readily observe that numerous modifications and alterations of the device and method may be made while retaining the teachings of the invention.

What is claimed is:

1. A method of forming a non-planar FET, comprising:
   providing a substrate, wherein an active region, an isolation region, and a peripheral region are defined on the substrate;
   forming a first patterned mask layer on the substrate;
   forming a plurality of first trenches in the isolation region by patterning the substrate by using the first patterned mask layer as a mask, and forming a plurality of first shallow trench isolations by filling a first insulation layer in the first trenches;
   patterning the first patterned mask layer to form a second patterned mask layer;
   forming a plurality of second trenches in the active region by patterning the substrate by using the second patterned mask layer as a mask, and forming a plurality of second shallow trench isolations by filling a second insulation layer in the second trenches;
   after forming the first shallow trench isolations and the second shallow trench isolations, forming a plurality of fin structures by removing a part of each second shallow trench isolation and exposing a part of the substrate in the presence of the second patterned mask layer, wherein the exposed substrate becomes the fin structures, and the fin structures and the second shallow trench isolations are arranged alternatingly;
   forming a conductive layer on the substrate in the active region and the peripheral region to cover each fin structure; and
   patterning the conductive layer to make the conductive layer in the peripheral region become a gate of a planar field effect transistor and make the conductive layer in the active region become a gate of a non-planar FET.

2. The method of forming the non-planar FET according to claim 1, wherein the conductive layer comprises poly-silicon or metal.

3. The method of forming the non-planar FET according to claim 1, wherein the first shallow trench isolations are formed before forming the second shallow trench isolations.

4. The method of forming the non-planar FET according to claim 1, wherein in the step of forming the fin structures, the patterned mask layer has at least an opening on the substrate, wherein a sidewall of the opening is disposed corresponding to the most peripheral second shallow trench isolation.

5. The method of forming the non-planar FET according to claim 1, wherein a thickness of the first shallow trench isolation is between 2000 Å and 3000 Å.

6. The method of forming the non-planar FET according to claim 1, wherein a thickness of the second shallow trench isolation is between 200 Å and 500 Å.

7. The method of forming the non-planar FET according to claim 1, wherein the gate of the planar field effect transistor is level with the gate of the non-planar FET.

8. The method of forming the non-planar FET according to claim 1, further comprising forming a source/drain region in the fin structure at two sides of the gate of the non-planar FET.

9. The method of forming the non-planar FET according to claim 1, wherein before forming the fin structures, a thickness of the first shallow trench isolation is different from a thickness of the second shallow trench isolation.

10. The method of forming the non-planar FET according to claim 1, wherein before forming the fin structures, a thickness of the first shallow trench isolation is greater than a thickness of the second shallow trench isolation.

11. The method of forming the non-planar FET according to claim 1, wherein a material of the first insulation layer is different from a material of the second insulation layer.

* * * * *